United States Patent
Gallmeyer et al.

(10) Patent No.: US 6,597,083 B2
(45) Date of Patent: Jul. 22, 2003

(54) METHOD AND APPARATUS FOR COMPENSATING FOR TEMPERATURE INDUCED DEFORMATION OF A PIEZOELECTRIC DEVICE

(75) Inventors: Christopher F. Gallmeyer, Peoria, IL (US); Larry Glenn Waterfield, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 10/025,400

(22) Filed: Dec. 19, 2001

(65) Prior Publication Data

US 2003/0111932 A1 Jun. 19, 2003

(51) Int. Cl.[7] .............................................. H01L 41/09
(52) U.S. Cl. ...................................... 310/315; 310/317
(58) Field of Search ........................... 310/315, 316.01, 310/317–319

(56) References Cited

U.S. PATENT DOCUMENTS

| | | | | |
|---|---|---|---|---|
| 3,719,838 A | * | 3/1973 | Peduto et al. ................ 310/315 |
| 4,460,840 A | | 7/1984 | Weiger et al. ................ 310/328 |
| 4,550,744 A | | 11/1985 | Igashira et al. ................ 137/80 |
| 4,570,098 A | | 2/1986 | Tomita et al. ................ 310/346 |
| 4,593,258 A | * | 6/1986 | Block ......................... 331/176 |
| 5,059,850 A | | 10/1991 | Yoshimura et al. .......... 310/328 |
| 5,126,618 A | | 6/1992 | Takahashi et al. ........... 310/346 |
| 5,365,140 A | | 11/1994 | Ohya et al. ................... 310/328 |
| 5,668,506 A | * | 9/1997 | Watanabe et al. ............. 331/66 |
| 5,796,206 A | * | 8/1998 | Asai et al. ................... 310/317 |
| 6,147,434 A | * | 11/2000 | Nakano et al. .............. 310/317 |
| 6,400,062 B1 | * | 6/2002 | Gallmeyer et al. .......... 310/315 |
| 6,437,481 B2 | * | 8/2002 | Senda et al. ................. 310/317 |
| 6,486,743 B2 | * | 11/2002 | Hasegawa et al. ............. 331/25 |
| 6,501,340 B1 | * | 12/2002 | Flood ............................ 331/69 |
| 6,522,048 B1 | * | 2/2003 | Burns et al. ............ 310/316.01 |
| 2001/0017574 A1 | * | 8/2001 | Oka ........................ 331/116 R |

FOREIGN PATENT DOCUMENTS

| | | | | |
|---|---|---|---|---|
| EP | 0740421 A2 | * | 10/1996 | ............. H03L/1/02 |
| JP | 2-184277 | * | 7/1990 | ............. H02N/2/00 |

OTHER PUBLICATIONS

NASA/CR–1998–208708 Properties of PZT–Based Piezoelectric Ceramics Between –150 and 250 degrees C –Sep. 1998 –M. W. Hooker.

* cited by examiner

*Primary Examiner*—Thomas M. Dougherty
(74) *Attorney, Agent, or Firm*—Cliff Green

(57) ABSTRACT

The present invention provides methods and apparatus for controlling an electric field across a piezoelectric device. A temperature determining device transmits a temperature signal indicative of a temperature of the piezoelectric device. A control device receives the temperature signal and a first control signal indicative of a desired displacement of the piezoelectric device. The control device transmits a second control signal to the piezoelectric device as a function of the temperature signal and the control signal. The second control signal creates the electric field across the piezoelectric device, when the temperature of the piezoelectric device is below a predetermined threshold, having a magnitude above a normal operating range for the piezoelectric device.

27 Claims, 2 Drawing Sheets

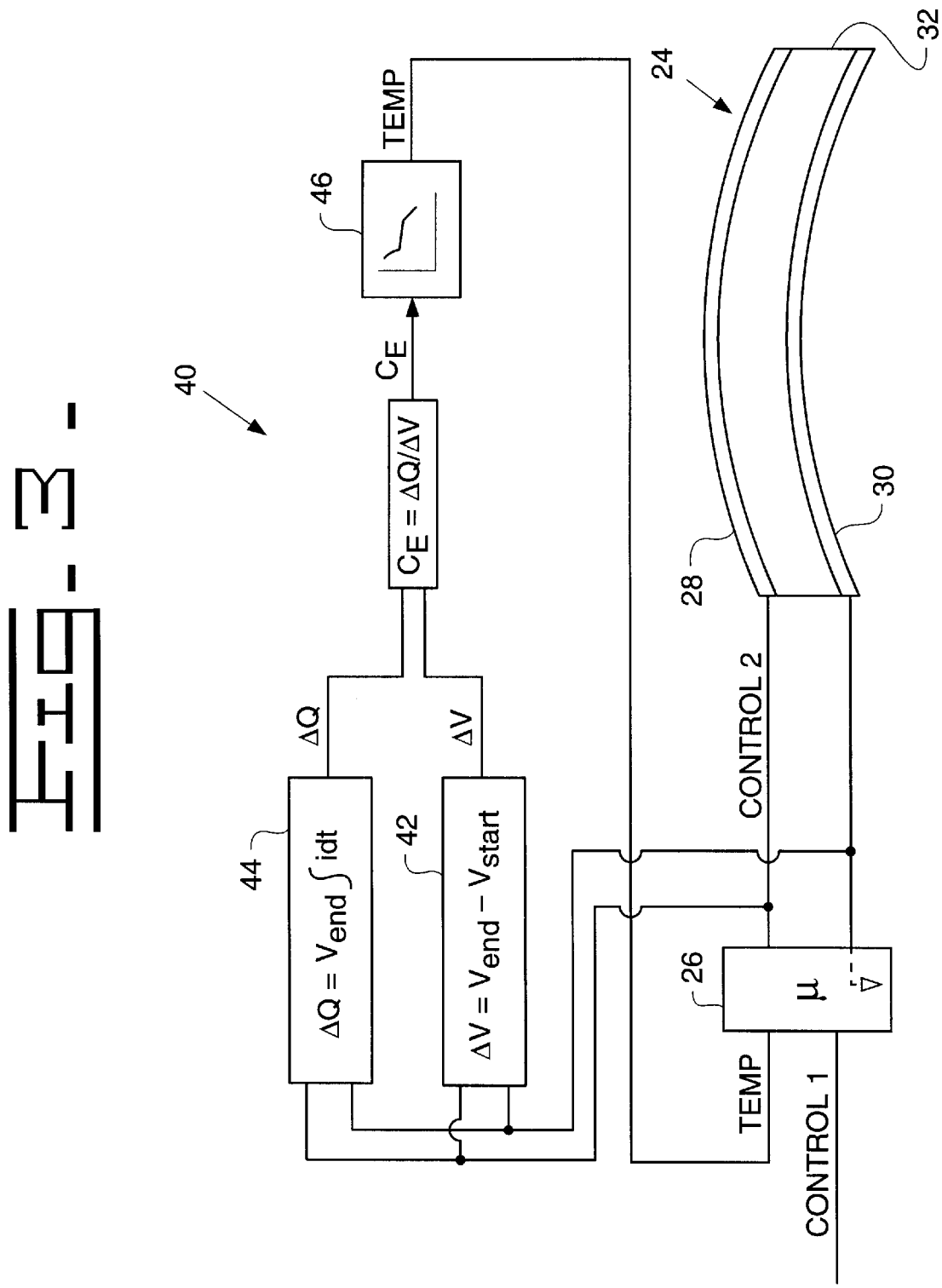

METHOD AND APPARATUS FOR COMPENSATING FOR TEMPERATURE INDUCED DEFORMATION OF A PIEZOELECTRIC DEVICE

TECHNICAL FIELD

This invention relates generally to a piezoelectric device, and more specifically to controlling the displacement of the piezoelectric device over a temperature range.

BACKGROUND

Piezoelectric devices, such as piezoelectric actuators, generally consist of a piezoelectric material that deforms when an electric field, e.g., a driving field, is applied across it. Additional materials may be bonded with the piezoelectric material, such as metallic layers that act as electrodes, insulating materials to prevent current from flowing between particular areas of the device, and adhesives to bond the various layers together.

In simplified terms, piezoelectric materials are comprised of many dipole unit cells. FIG. 1 symbolically depicts a unit cell 10 of a piezoelectric material. When an electric field E1 is applied in the direction shown, the unit cell grows in the y axis and shrinks in the x axis, in essence becoming tall and thin. Conversely, when an electric field E2 is applied in the direction shown, the unit cell shrinks along the y axis and grows along the x axis, in essence, becoming short and fat.

As the unit cell 10 becomes colder, the piezoelectric effect, i.e., response to the application of an electric field, decreases. Thus, for a given magnitude of an electric field, the unit cell will not grow/shrink as much as it did when it was warmer. As a practical matter, for the same electric field applied, this decreases the stroke of the piezoelectric device. For example, for some piezoelectric materials, a 35% loss of stroke was found when the temperature changed from 25 degrees Celsius to −40 degrees Celsius.

To complicate matters, piezoelectric materials have predetermined operating ranges for the electric fields that are applied to them. Applying an electric field in excess of the maximum operating range may cause excessive domain wall motion, i.e., dipole switching for a group of commonly polarized/aligned unit cells, causing fatigue and micro-cracking. This may significantly decrease the performance and life of the piezoelectric material. Even higher electric fields can cause dielectric strength to become a concern.

SUMMARY OF THE INVENTION

The present invention provides methods and apparatus for controlling an electric field across a piezoelectric device. A temperature determining device transmits a temperature signal indicative of a temperature of the piezoelectric device. A control device receives the temperature signal and a first control signal indicative of a desired displacement of the piezoelectric device. The control device transmits a second control signal to the piezoelectric device as a function of the temperature signal and the control signal. The second control signal creates the electric field across the piezoelectric device, when the temperature of the piezoelectric device is below a predetermined threshold, having a magnitude above a normal operating range for the piezoelectric device.

BRIEF DESCRIPTION OF THE DRAWINGS

FIGS. 2 and 3 show apparatuses for controlling an electric field across a piezoelectric device according to one embodiment of the invention.

DETAILED DESCRIPTION

Figure 1:
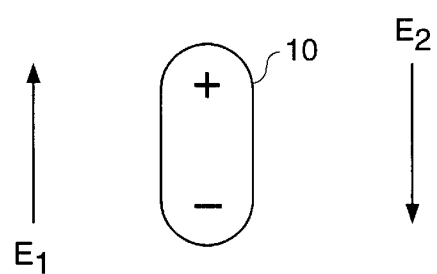
FIG. 1 symbolically depicts a unit cell of a piezoelectric material.
Figure 2:
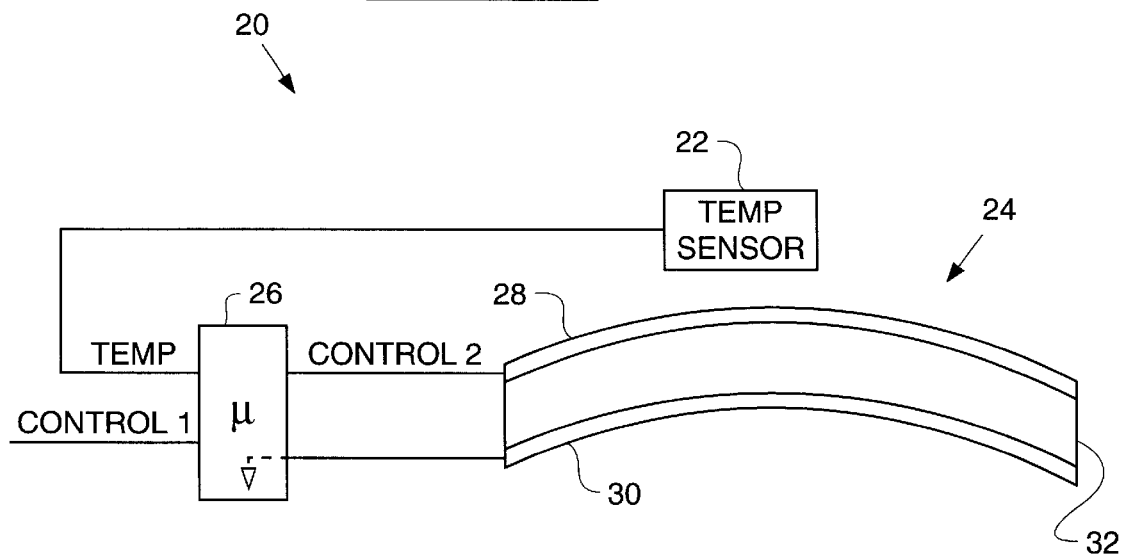

FIG. 2 shows an apparatus 20 for controlling an electric field across a piezoelectric device according to one embodiment of the invention. A temperature determining device, such as a temperature sensor 22 or other device described below, determines or detects a temperature of the piezoelectric device, such as a piezoelectric actuator 24, or a temperature proximate to the piezoelectric device, and transmits a temperature signal TEMP indicative of that temperature, i.e., a value indicative of the approximate temperature.

A control device, such as a microcontroller or microprocessor 26, may receive the temperature signal TEMP from the temperature sensor 22 and also receive a first control signal CONTROL1 indicative of a desired displacement, e.g., position or velocity, of the piezoelectric actuator 26. The first control signal may be generated by any of a variety of ways known to those skilled in the art. Although the piezoelectric actuator 24 is depicted as a thermally prestressed bender actuator, a variety of other piezoelectric actuators could also be used, such as a variety of unimorph, bimorph, and/or stacks known to those skilled in the art.

The microprocessor 26 transmits a second control signal CONTROL2 to the piezoelectric device 24 as a function of the temperature signal TEMP and the first control signal CONTROL1. The second control signal CONTROL2 creates an electric field across the piezoelectric device 24 by any of a variety of ways known to those skilled in the art. For example, the second control signal CONTROL2 could be a voltage or current/charge applied to a first electrode 28 of the piezoelectric actuator 26. Other ways for generating an electric field across the piezoelectric actuator 26 may also be used.

A second electrode 30 may be spaced some distance from the first electrode 28, with a piezoelectric material 32 disposed therebetween. The second electrode 30 is typically grounded, although in other embodiments it need not be, thereby creating an electrical field between the two electrodes 28, 30, and across the piezoelectric material 32. In other embodiments, a third control signal, such as the complement of the second control signal CONTROL2 or some other voltage, current and/or charge could be applied to the second electrode 30.

By appropriate selection of the voltage across the piezoelectric material 32, a respective electric field is created. In one embodiment of the invention, up to eight hundred (800) volts, for example, may be applied as the second control signal CONTROL2, for example, when using PZT-5A as the piezoelectric material 32. This represents an over-voltage, e.g., typically greater than 20% of the maximum operating range, although percentages of 10% or even less may be used to define the term, based on a normal operating voltage of 0–500 V.

The piezoelectric actuator 24 will have a normal operating range for the electric field that is usually dependent of the type of piezoelectric material 32 being used. Typically the normal operating range for the electric field may be defined as the magnitude of electric field that may be applied to induce movement by the piezoelectric material 32 without causing excessive fatigue or micro-cracking, although other appropriate definitions known to those skilled in the art may also apply. For example, piezoelectric material PZT-5A normally has a maximum operating range for the electric field of approximately 20 kV/cm, i.e., the normal operating range is about 0–20 kV/cm.

The microprocessor 26 may be configured to transmit the second control signal CONTROL2 so that it causes an electric field in the piezoelectric material 32 excess of or above the maximum operating range for the piezoelectric material 32 when the temperature of the piezoelectric material, as indicated by the temperature signal TEMP, is below a predetermined threshold, such as zero (0) degrees Celsius. Other predetermined thresholds may be used as appropriate, and as suggested by the discussion below.

By applying the second control signal in this fashion, excessive fatigue and micro-cracking may be reduced or minimized. Although the electric field is higher than the normal operating range, because the piezoelectric material 32 is at a low(er) and/or cold temperature, the domain wall motion, i.e., change in shape of the unit cell, of the piezoelectric material is suppressed. Further, the dielectric strength of piezoelectric material typically increases as temperature decreases. Thus, the two effects of fatigue and cracking that might occur at higher temperatures are reduced.

By appropriate manipulation of the second control signal CONTROL2, the extent to which the electric field is outside of the normal operating range may vary as a function of the temperature signal TEMP. Typically the colder the temperature, as reflected by the temperature signal TEMP, the farther outside the normal operating range the electric field may be. In other embodiments, the electric field could be other functions of temperature, such as a step function, or some power of the temperature, e.g., squared, cubed, etc.

Even higher electric fields may be applied to the piezoelectric material 32 at cold temperatures for short duration due to the higher dielectric strength. Thus, for example, at minus forty (−40) degrees Celsius, fields of 35 kV/cm or more may be applied to PZT-5A piezoelectric material 32 for a limited time in order to regain lost performance. Other field strengths may be selected as appropriate, and may vary depending on the particular piezoelectric material 32 being used.

Although the temperature determining device is depicted as being separate from the control device, in embodiments of the invention the two may be integrated.

In embodiments of the invention, the microprocessor 26 may also be configured to transmit the second control signal CONTROL2 so that it causes an electric field in the piezoelectric material 32 lower than the maximum operating range, e.g., is within a normal operating range, for the piezoelectric material 32 when the temperature of the piezoelectric material, as indicated by the temperature signal TEMP, is at or above the predetermined threshold, such as zero (0) degrees Celsius.

FIG. 3 shows another embodiment of the invention in which the temperature of the piezoelectric actuator 24 or the temperature proximate the piezoelectric actuator 24 may be determined from an estimated ferroelectric polarization of the piezoelectric device. More particularly, instead of the temperatures sensor 22, the temperature determining device may include a polarization estimating circuit 40 that is coupled with the piezoelectric actuator by ways known to those skilled in the art, as will be evident from the discussion below.

For a predetermined duration of time, the polarization estimating circuit 40 determines the change in applied voltage ΔV to the piezoelectric actuator 24 by ways known to those skilled in the art, such as with a comparator circuit 42, for example. During that same general duration of time, the polarization estimating circuit 40 determines the change in charge ΔQ on the piezoelectric actuator 24, such as by a current integrating circuit 44, for example, coupled with the piezoelectric actuator 24 by ways known to those skilled in the art.

From the values for the changes in voltage ΔV and charge ΔQ, an equivalent capacitance CE of the actuator 12 may be determined generally by the following equation, where the equivalent capacitance CE is dependent on the physical construction of the actuator 12 and on the temperature proximate the operating environment of the actuator 12:

$$CE = \Delta Q / \Delta V$$

Typically, more accurate estimations of the equivalent capacitance CE are obtained with values for the change in voltage ΔV that are a significant portion (>50%) of the full voltage range of the piezoelectric actuator 24. Smaller percentages may also be used, although accuracy in the equivalent capacitance CE calculation may suffer. The voltage vs. charge hysteresis curve of the piezoelectric actuator 24 will typically determine the minimum value of ΔV that may be used in this calculation without a significant loss of accuracy.

The polarization estimating circuit 40 may include an empirical map or data structure 46 that is operable to receive the equivalent capacitance CE as an input to the data structure 46. The empirical map or data structure 46 is typically derived from the ferroelectric polarization hysteresis curves of the piezoelectric actuator 24 to generate the temperature signal TEMP.

The equivalent capacitance CE effectively gives a unique slope value on the ferroelectric polarization hysteresis curves that can be correlated to the estimated temperature proximate the piezoelectric actuator 24, as will be appreciated by those skilled in the art. The data structure 46 may be a look-up table stored in RAM or ROM, a software algorithm or a hardwired circuit that is operable to generate the temperature signal TEMP in response to the equivalent capacitance CE.

The apparatus 20 otherwise functions similarly to that which is described above in the first embodiment of the invention, and the description of the apparatus 20 will not be repeated here.

INDUSTRIAL APPLICABILITY

In operation, the temperature determining device, e.g., temperature sensor 22 determines the temperature of the piezoelectric device, such as the piezoelectric actuator 24, or the temperature proximate the piezoelectric device. The temperature sensor 22 transmits a temperature signal TEMP indicative of the respective temperature to a control device, such as the microprocessor 26. The microprocessor 26 also receives a first control signal CONTROL1 indicative of a desired displacement of the piezoelectric actuator 24. The microprocessor 26 transmits a second control signal CONTROL2 to the piezoelectric actuator 24 as a function of the temperature signal TEMP and the first control signal CONTROL1.

The second control signal CONTROL2 may be used to compensate for the loss of performance of the piezoelectric actuator 24 due to cold temperatures, and may do so selectively when the temperature drops below some threshold, or as a constant temperature compensation. The second control signal CONTROL2 may be configured so as to create an electric field across or in the piezoelectric actuator that exceeds the maximum recommended operating range, and do so without causing excessive fatigue or micro-cracking of the piezoelectric material. Thus, the apparatus 20 may be used to compensate for loss of performance, e.g., stroke, due to the piezoelectric device operating in cooler or cold temperatures.

As indicated above, the apparatus 20 may create an electric field across the piezoelectric device having a magnitude within or approximately within the normal operating range for the piezoelectric device, when the temperature is at or above some predetermined threshold.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for controlling an electric field across a piezoelectric device, comprising:
    a temperature determining device operable to transmit a temperature signal indicative of a temperature of the piezoelectric device; and
    a control device coupled with the temperature determining device to receive the temperature signal and operable to receive a first control signal indicative of a desired displacement of the piezoelectric device, the control device operable to transmit a second control signal to the piezoelectric device as a function of the temperature signal and the control signal, the second control signal operable to create the electric field across the piezoelectric device, when the temperature of the piezoelectric device is below a predetermined threshold, having a magnitude above a normal operating range for the piezoelectric device.

2. The apparatus of claim 1 wherein the normal operating range of the electric field comprises approximately 0–20 kV/cm.

3. The apparatus of claim 1 wherein the second control signal is operable to create an electric field across the piezoelectric device, when the temperature is at or above the predetermined threshold, having a magnitude within or approximately within the normal operating range for the piezoelectric device.

4. The apparatus of claim 1 wherein the piezoelectric device comprises a piezoelectric actuator.

5. The apparatus of claim 4 wherein the piezoelectric actuator comprises a thermally pre-stressed bender actuator.

6. The apparatus of claim 1 wherein the temperature determining device comprises a temperature sensor.

7. The apparatus of claim 1 wherein the temperature determining device comprises a temperature determining circuit coupled with the piezoelectric device, the temperature determining circuit operable to determine an equivalent capacitance of the piezoelectric device, and to transmit a value indicative of an approximate temperature of the piezoelectric device as a function of the equivalent capacitance of the piezoelectric device.

8. The apparatus of claim 1 wherein the temperature determining device comprises a temperature determining circuit coupled with the piezoelectric device, the temperature determining device operable to determine a voltage and at least one of a current and a charge applied to the piezoelectric device, and to transmit a value indicative of an approximate temperature of the piezoelectric device as a function of the voltage and the at least one of the current and the charge applied to the piezoelectric device.

9. The apparatus of claim 8 wherein the value indicative of an approximate temperature of the piezoelectric device comprises an equivalent capacitance of the piezoelectric device.

10. A method for providing a control signal for a piezoelectric device, comprising:
    determining a desired displacement of the piezoelectric device;
    determining a value indicative of an approximate temperature of the piezoelectric device;
    transmitting a second desired position signal as a function of the desired displacement of the piezoelectric device and the value indicative of the temperature of the piezoelectric device, the second desired position signal operable to cause an electric field to be applied to the piezoelectric device, when the temperature of the piezoelectric device is below a predetermined threshold, having a magnitude generally above a normal operating range for the piezoelectric device.

11. The method of claim 10 wherein the normal operating range of the electric field comprises approximately 0–20 kV/cm.

12. The method of claim 10 wherein the second desired position signal is further operable to cause an electric field to be applied to the piezoelectric device, when the temperature of the piezoelectric device is at or above the predetermined threshold, having a magnitude generally within the normal operating range for the piezoelectric device.

13. The method of claim 10 wherein the piezoelectric device comprises a piezoelectric actuator.

14. The method of claim 13 wherein the piezoelectric actuator comprises a thermally pre-stressed bender actuator.

15. The method of claim 10 wherein the value indicative of an approximate temperature of the piezoelectric device comprises an equivalent capacitance of the piezoelectric device.

16. A method for applying an electric field to a piezoelectric device, comprising:
    creating an electric field across the piezoelectric device having a magnitude generally within a first predetermined operating range when the temperature of the piezoelectric device is at or above a predetermined threshold; and
    creating an electric field across the piezoelectric device having a magnitude generally above the first predetermined operating range when the temperature of the piezoelectric device is below the predetermined threshold.

17. The method of claim 16 wherein the first predetermined operating range comprises about 0 kV/cm to a maximum desired operating field strength.

18. The method of claim 16 wherein the first predetermined operating range comprises about 0–20 kV/cm.

19. The method of claim 16 wherein the predetermined threshold comprises about zero degrees Celsius.

20. The method of claim 16 wherein creating an electric field across the piezoelectric device comprises applying a voltage across the piezoelectric device.

21. A method for applying a voltage to a piezoelectric device, comprising:
    applying a voltage within a normal operating range to the piezoelectric device when the temperature of the piezoelectric device is generally at or above a predetermined temperature; and applying an over-voltage to the piezoelectric device when the temperature of the piezoelectric device is generally below the predetermined temperature.

22. The method of claim 21 wherein the predetermined temperature comprises approximately zero degrees Celsius.

23. The method of claim 21 wherein the overvoltage comprises at least approximately 20% more voltage than the maximum normal operating voltage.

24. The method of claim 21 wherein the maximum normal operating voltage comprises approximately 500 volts.

25. A method for applying a driving field to a piezoelectric device, comprising:

applying a driving field having a magnitude within a normal operating range to the piezoelectric device when the temperature of the piezoelectric device is generally at or above a predetermined temperature; and applying a driving field having a magnitude in excess of the normal operating range to the piezoelectric device when the temperature of the piezoelectric device is generally below the predetermined temperature.

26. The method of claim 25 wherein the normal operating range comprises approximately 0–20 kV/cm.

27. The method of claim 25 wherein the driving field in excess of the normal operating range comprises a driving field in excess of approximately 25 kV/cm.

* * * * *